United States Patent
Rubia Mena et al.

(10) Patent No.: US 9,914,388 B2
(45) Date of Patent: Mar. 13, 2018

(54) LIGHTING AND/OR SIGNALING ASSEMBLY, INCLUDING AN ADAPTER THAT CAN BE HOUSED IN A MOTOR VEHICLE LIGHTING MODULE

(71) Applicant: Valeo Iluminacion, Martos (ES)

(72) Inventors: Juan-Antonio Rubia Mena, Martos (ES); Alberto Rodriguez-Fuentes, Jaen (ES); Jose Castillo Jimenez, Martos (ES); Francisco Ojeda, Martos (ES); Jose-Antonio Aguilar Del Moral, Jaen (ES)

(73) Assignee: VALEO ILUMINACION, Martos (ES)

( * ) Notice: Subject to any disclaimer, the term of this patent is extended or adjusted under 35 U.S.C. 154(b) by 165 days.

(21) Appl. No.: 14/661,553

(22) Filed: Mar. 18, 2015

(65) Prior Publication Data

US 2015/0266407 A1    Sep. 24, 2015

(30) Foreign Application Priority Data

Mar. 20, 2014   (FR) ...................................... 14 52339

(51) Int. Cl.
*F21V 19/00*   (2006.01)
*B60Q 1/00*    (2006.01)
(Continued)

(52) U.S. Cl.
CPC ........ *B60Q 1/0064* (2013.01); *F21S 48/1109* (2013.01); *F21S 48/1118* (2013.01); *F21S 48/1159* (2013.01); *F21V 7/0066* (2013.01); *F21V 19/002* (2013.01); *F21V 19/004* (2013.01); *F21S 48/321* (2013.01);
(Continued)

(58) Field of Classification Search
CPC .. F21V 19/003; F21V 19/0035; F21V 19/004; B60Q 1/0064; F21S 48/1118; F21S 48/1159
See application file for complete search history.

(56) References Cited

U.S. PATENT DOCUMENTS 4,614,997 A * 9/1986 Montet ................ F21S 48/1118
16/373
6,155,694 A * 12/2000 Lyons .................. B60Q 1/2611
315/178

(Continued)

FOREIGN PATENT DOCUMENTS

DE   29724765 U1   11/2003
DE   10343470 A1   5/2005
(Continued)

*Primary Examiner* — Julie Bannan
(74) *Attorney, Agent, or Firm* — Oblon, McClelland, Maier & Neustadt, L.L.P.

(57) ABSTRACT

A motor vehicle lighting and/or signaling assembly including: a lighting module and an adapter that can be placed and retained in position in a housing of support means of an optical collector, and separate means for pressing the adapter against the support means of the module in a first direction and for adjusting the adapter in the housing of the support means in a second direction other than the first direction, these pressing and adjustment means being carried by the module and/or by the adapter. The invention further concerns the associated adapter and the associated module in this lighting and/or signaling assembly.

16 Claims, 3 Drawing Sheets

(51) Int. Cl.
  *F21S 8/10* (2006.01)
  *F21V 7/00* (2006.01)
  *H01L 23/40* (2006.01)

(52) U.S. Cl.
  CPC ......... *F21S 48/328* (2013.01); *H01L 23/4006* (2013.01); *H01L 23/4093* (2013.01); *H01L 2924/0002* (2013.01)

(56) References Cited

U.S. PATENT DOCUMENTS

| | | | | |
|---|---|---|---|---|
| 6,502,968 | B1* | 1/2003 | Simon | H05K 1/141 362/249.04 |
| 7,441,933 | B2* | 10/2008 | Tsukamoto | F21S 48/1109 362/545 |
| 8,109,659 | B2* | 2/2012 | Doubek | F21V 17/164 362/147 |
| 8,814,383 | B2* | 8/2014 | Bizzotto | F21V 21/08 362/237 |
| 8,967,843 | B2 | 3/2015 | Jackl et al. | |
| 2005/0211416 | A1* | 9/2005 | Kawabata | H01L 21/4882 165/80.3 |
| 2008/0087911 | A1* | 4/2008 | Stoyan | F21K 9/00 257/99 |
| 2008/0144289 | A1* | 6/2008 | Desrosiers | G01R 1/0458 361/719 |
| 2011/0038147 | A1* | 2/2011 | Lin | F21V 19/004 362/235 |
| 2013/0121759 | A1* | 5/2013 | Breidenassel | F21V 7/00 403/330 |
| 2013/0128582 | A1* | 5/2013 | Holec | H05K 1/189 362/249.02 |
| 2013/0215632 | A1 | 8/2013 | Jackl et al. | |
| 2014/0247611 | A1 | 9/2014 | Sachsenweger et al. | |
| 2015/0292682 | A1* | 10/2015 | Yang | F21K 9/175 362/659 |
| 2016/0195249 | A1* | 7/2016 | Liao | F21V 19/004 362/368 |

FOREIGN PATENT DOCUMENTS

| | | |
|---|---|---|
| FR | 2950129 A1 | 3/2011 |
| JP | 2011129308 A | 6/2011 |
| WO | 2012048351 A1 | 4/2012 |
| WO | 2013053626 A1 | 4/2013 |
| WO | 2014028955 A1 | 2/2014 |

\* cited by examiner

LIGHTING AND/OR SIGNALING ASSEMBLY, INCLUDING AN ADAPTER THAT CAN BE HOUSED IN A MOTOR VEHICLE LIGHTING MODULE

CROSS-REFERENCE TO RELATED APPLICATIONS

This application claims priority to French Application No. 1452339 filed on Mar. 20, 2014, which application is incorporated herein by reference and made a part hereof.

BACKGROUND OF THE INVENTION

1. Field of the Invention

The present invention relates to the field of motor vehicle lighting and/or signaling and it concerns more particularly the design of lighting modules including a light source oriented to emit rays in the direction of a collector.

2. Description of the Related Art

Such modules are known in which the light source consists in a light-emitting diode, where the aim is to position it at the focus of a substantially elliptical collector so that the rays emitted are directed parallel to the optical axis toward an optical system at the exit from the module. Clearly the conformity of the orientation of the outgoing rays depends notably on the correct positioning of the light-emitting diode emitting the rays relative to the collector and notably relative to the first of the two foci of the collector, the optical system being faced in the vicinity of the second focus. To this end, motor vehicle manufacturers aim to obtain in their manufacturing and assembly process modules of great precision.

Light-emitting diodes have, among other advantages, a service life greater than that which other types of light source can have. However, it is clear that for various reasons the owner of the vehicle may need to replace the light-emitting diode in the module. The positioning of this new light source must again be very precise, so that the vehicle's lighting and/or signaling quality remains the same. This problem also arises, and much more frequently, if the light sources are formed by discharge lamps or halogen lamps, for example.

The document FR2950129 discloses an optical module including collector support means. The support means include a housing that can receive an adapter to which are fixed a printed circuit board and a light-emitting diode. If the diode needs to be changed, it then suffices to withdraw the adapter, to place a new diode on the printed circuit board, and to replace the adapter in the housing.

The adapter is retained in place in two directions in space by the walls of the housing and means are provided for locking it in position in the third direction in space to fix the position of the adapter, which must be precise for the diode carried by the adapter to be positioned precisely relative to the first focus of the collector, which collects the rays emitted from the diode.

SUMMARY OF THE INVENTION

A problem addressed by the present invention is to improve this type of lighting module to make it possible to ensure the correct position of the light source relative to the collector regardless of how many times the light source is replaced.

While the invention concerns a lighting module as just described hereinabove in that it includes means for positioning an adapter carrying a light source to be placed at the focus of an optical system, the invention also concerns the corresponding adapter.

The adapter in accordance with the invention can be placed and retained in position in a housing of support means of an optical collector of a motor vehicle, includes a light source fastened to one face of the adapter, and includes on a face opposite the support face of the light source at least one receiving area of pressing means acting in a first direction, and elastic return means that can be compressed in a second direction other than the first direction, notably perpendicular to the first direction.

According to various features, separately or in combination:

the elastic return means are on an edge surface of the adapter, the edge surface being notably perpendicular to the support face;

the elastic return means take the form of a leaf spring;

the leaf spring is fixed at its center to be pressed against the edge surface of the adapter, and having a curved shape so that in a rest position of the spring its ends are away from the edge surface;

the leaf spring further includes a lug that extends from the center thereof and that engages with a pin fastened to the face of the adapter opposite the support face of the light source;

the light source is a light-emitting diode; in accordance with one embodiment, it is carried by a printed circuit board fastened to the support face of the adapter;

the face opposite the support face of the light source includes ribs that project in the first direction;

the area receiving pressing means consists in grooves that extend in the second direction along edges of the adapter;

the area receiving pressing means consists in a transverse channel that extends perpendicularly to the second direction.

The invention also concerns a lighting module, notably for lighting and/or signaling in a motor vehicle, including a collector that can reflect light rays so that the latter are emitted along a given optical axis, and including support means partly covering the collector, the support means including a housing that can receive an adapter as described above. The module in accordance with the invention advantageously includes separate means for pressing the adapter in a first direction and for the adjustment in position of the adapter in a second direction other than the first direction, notably perpendicular to the first direction.

In accordance with one embodiment of the invention, the lighting module includes elastic return means that can be compressed in the second direction. These elastic return means are notably carried by the support means and are intended to be compressed by an adapter, which for its part then need not include any elastic return means. These elastic return means carried by the lighting module can have the same features as those of the elastic return means described above for the adapter.

The position adjustment means carried by the module may consist in a clamping screw disposed transversely to an end wall of the housing, the screw being adapted to cooperate with a threaded bore in the end face to penetrate into the housing in the second direction as a result of its rotation, in order to press against the adapter. In order to refine the adjustment in this second direction, the clamping screw could be a micrometer screw.

In accordance with features of two separate embodiments, the end wall of the housing carrying the threaded bore could be formed in the thickness of the support means or by a part mounted on and fixed to the support means.

The pressing means advantageously takes the form of a rigid wire articulated, for example to the support means, so as to go from an open position, in which the wire allows free access to the housing formed in the support means, to a closed position, in which the wire is across the housing, the wire being held in this closed position by clipping hooks formed by deformation of the wire into female receiving means provided for this purpose on the support means.

In accordance with one embodiment of the invention, the pressing means take the form of a flat spring fixed onto pins formed laterally in the support means of the module, so as to extend transversely above the adapter.

The invention further concerns a motor vehicle lighting or signaling assembly including a lighting module and an adapter, wherein:

the adapter is placed and retained in position in the housing of the support means of the optical collector, includes a light source fastened to one face of the adapter, and includes on a face opposite the support face of the light source at least one area receiving pressing means acting in a first direction, the module and the adapter carry separate means for pressing the adapter against the support means of the module in a first direction and for the adjustment in position, in a second direction other than the first direction, of the adapter in a housing formed in the support means, and the lighting and/or signaling assembly includes elastic return means adapted to be compressed in the second direction, these elastic return means being positioned between the support and the adapter and carried by the support and/or the adapter.

The second direction may for example be perpendicular to the first direction.

In such an assembly, the position adjustment means may include an adjustment screw carried by the support means and elastic return means carried by the adapter, the action of the adjustment screw against a face of the adapter leading to the compression of the elastic return means between an opposite face of the adapter against a wall of the housing formed in the support means.

In accordance with one embodiment, the adapter is an adapter in accordance with the invention, as described above.

The invention also concerns a motor vehicle in which a lighting module as described above is used for lighting and/or signaling in the motor vehicle.

These and other objects and advantages of the invention will be apparent from the following description, the accompanying drawings and the appended claims.

BRIEF DESCRIPTION OF THE ACCOMPANYING DRAWINGS

Other features and advantages of the invention will become apparent on reading the following detailed description of one embodiment, to understand which reference should be made to the appended figures, in which.

DETAILED DESCRIPTION OF THE PREFERRED EMBODIMENTS

Hereinafter, the longitudinal direction L refers to the direction in which the motor vehicle travels and the transverse direction T refers to a horizontal direction perpendicular to this longitudinal direction. The vertical direction V refers to the direction perpendicular to the previous two, which moreover define a horizontal plane. The trihedron L, V, T is shown in the figures to facilitate reading them. However, it will be clear that the lighting module may be arranged in accordance with some other orientation without departing from the context of the invention.

As shown in the figures, a lighting and/or signaling assembly 1 includes a lighting module 2 formed of support means 4 on which is mounted a substantially elliptical collector 6 that is able to divert the light rays emitted by a light source 12. The support means 4 features a housing 8 to receive an adapter 10 carrying the light source 12.

In the following example, the light source 12 is a light-emitting diode mounted on a printed circuit board 13 and able to emit light rays as a function of an electrical command instruction. It will be clear that other types of light sources could be used without departing from the context of the invention.

The lighting module 2 further includes an optical element, not represented here, associated with the elliptical collector 6 and also carried by the support means 4, this optical element being disposed at the second focus of the elliptical collector 6 while the light source 12 must be disposed substantially at the first focus of the elliptical collector 6. This arrangement enables most of the rays emitted by the light source 12 and passing through the second focus of the elliptical collector 6 to be reflected by the optical element in the lighting direction corresponding to its optical axis.

The elliptical collector 6 includes a substantially elliptical reflective surface, which can take the form of an angular sector of a substantially circular part. Note however that the surface need not be perfectly elliptical and may have a number of specific profiles designed to optimize the distribution of light in the lighting beam produced by the lighting module 2, as shown in the figures.

The elliptical collector 6 further includes a fixing plate 14 that extends one end of the elliptical collector 6 in the transverse direction so as to offer a substantially plane bearing surface that can come into contact with a lower face of the support means 4. The fixing plate 14 further includes indexing pins 16 that project from the fixing plate 14 and, as will be described hereinafter, are exposed when the elliptical collector 6 is mounted against the support means 4 at the level of the housing 8.

The support means 4 therefore enable fixing of the elliptical collector 6, notably by way of screw means and a fixing cylinder 17, and further enables fixing of the light source 12 in the vicinity of the first focus of the elliptical collector 6, via the adapter 10.

The upper face of the support means 4, facing away from the elliptical collector 6, includes ribs 18 that project from the support means 4. It will be clear from the following description that these ribs 18 advantageously serve as heatsinks, so as to evacuate the heat generated by the printed circuit board 13 when the light source 12 takes the form of a light-emitting diode.

The support means 4 further include the housing 8 receiving the adapter 10 as will be described in a complementary embodiment hereinafter.

The housing 8 is formed by an area of the support means 4 without any ribs 18 and includes a bottom wall 20 and four upstanding walls.

In the following description, the housing 8 is oriented so that the bottom wall 20 is substantially horizontal and the upstanding walls are substantially vertical. Moreover, the upstanding walls comprise a front transverse wall 22 and a rear transverse wall 24 that extend transversely and two longitudinal walls 26 and 28. The front and rear transverse walls 22 and 24 are therefore identified as a function of their position on the longitudinal axis, the front transverse wall 22 being the wall nearer the exit face of the lighting module 2. It is clear that the orientations chosen here could be modified without departing from the context of the invention provided that the general arrangement of the lighting module 2 conforms to what is to be described, with a first direction that here corresponds to the vertical direction, a second direction that here corresponds to the longitudinal direction, and a third direction that here corresponds to the transverse direction.

The front transverse wall 22 forms a vertical plane contact surface.

The rear transverse wall 24 is parallel to the front transverse wall 22 and is advantageously formed by an attached part, as shown in the figures, although it may be formed directly in the material of the support means 4, in the same way as the front transverse wall 22. It will be clear that using an attached part facilitates insertion of the adapter 10 in the housing 8 and its removal therefrom, although possibly necessitating a preliminary operation of removing the attached part. The rear transverse wall 24 is moreover pierced at its center and machined to form a threaded bore 30 adapted to cooperate with a clamping screw 32.

To this end the clamping screw 32 has a diameter and an external thread pitch substantially corresponding to the inside diameter of the threaded bore 30. The clamping screw 32 moves in the second direction, here longitudinally, relative to the rear transverse wall 24 when the clamping screw 32 is rotated. It moves between a disengaged position, in which it projects little if at all into the housing 8, and a clamping position, in which it projects from the rear transverse wall 24 inside the housing 8. A micrometer screw could be used to refine the adjustment of the longitudinal movement of the clamping screw 32.

The longitudinal walls 26 and 28 are formed successively in the longitudinal direction by a first rib 34 projecting from the upper face of the support means 4 and a second rib 36 forming a stud and separated from the first rib 34 by a lateral clearance 38. They include a hole 40 through the first rib 34 and female clipping means formed by a transverse groove 42 on a rear face of the second rib 36, so that the groove 42 faces away from the first rib 34. As described hereinafter, the holes 40 enable articulation of pressing means that can, as described in detail hereinafter, be pressed onto the adapter 10 when it is in place in the housing 8, bearing against the bottom wall 20, and the clearances allow the pressing means to pass around the second rib 36 so that these pressing means can be clipped and fixed in a closed position.

Thus a wire 44 forming the pressing means is articulated to the support means 4 at the level of the two holes 40 so that it can be actuated between an open position in which it allows removal and insertion of the adapter 10 and a closed position in which it is pressed against the adapter 10, immobilizing it in the first direction, here vertically.

The articulated wire 44 has a U-shape, with two lateral branches 46 that are substantially the same except at their free end and a transverse branch 48 joining these two lateral branches 46.

Each lateral branch 46 includes successively extending the transverse branch 48 a connecting portion 50 substantially perpendicular to the transverse branch 48, a transversely diverging portion 52 forming a hook that includes at least one attachment portion 54 substantially parallel to the transverse branch 48, a bearing portion 56 substantially perpendicular to the transverse branch 48 that features a deformation forming an elbow 58 in a direction perpendicular to the connecting portion 50 and the transverse branch 48, and a free end 60 extending the bearing portion perpendicularly.

One of the branches has a more curved free end than the other, so that when these ends are engaged in the corresponding holes formed in the longitudinal walls 26 and 28 of the housing 8, to form anchor points of the wire 44 in the support means 4, one of these ends prevents the wire 44 from escaping in the transverse direction.

The bottom wall 20 of the housing 8 has a hole at its center and the corresponding hole 62 has dimensions equivalent to those of the printed circuit board 13.

The bottom wall 20 provides a bearing surface for the adapter 10 in a first direction, here vertical, while the hole 62 provides a clearance primarily to allow passage of the printed circuit board 13 and the light rays emitted by the light-emitting diode carried by this printed circuit board 13.

The bottom wall 20 is advantageously covered with a layer of thermally conductive material, notably on the longitudinal branches that flank the hole 62 transversely.

As just described, the housing 8 is able to receive the adapter 10 carrying the light source 12 so that the latter is placed correctly at the first focus of the elliptical collector 6.

The adapter 10 has a parallelepiped shape, which includes two parallel plane faces, with a first plane face 64 facing toward the interior of the lighting module 2 when the adapter 10 is in place in the lighting module 2 and an opposite second plane face 66 and two pairs of parallel sides, two transverse sides of which lie at the longitudinal ends of the adapter 10.

The first plane face 64 carries the light source 12 on the printed circuit board 13 to which is fixed the light-emitting diode or light source 12 adapted to emit most of its luminous energy away from the adapter 10, toward the reflective surface of the substantially elliptical surface of the elliptical collector 6.

The second plane face 66 carries ribs 68 forming heatsinks, which to this end project vertically from the adapter 10. It can be seen that when the adapter 10 is in place in the housing 8 a continuous area of ribs 68 forming heatsinks is therefore formed, the ribs 68 associated with the adapter 10 corresponding to the ribs 68 eliminated from the support means 4 by forming the housing 8.

The second plane face 66 also carries a pin 70 that projects vertically in the vicinity of a first transverse side 72, the pin 70 extending vertically above the free edge of the ribs 68.

Figure 1:
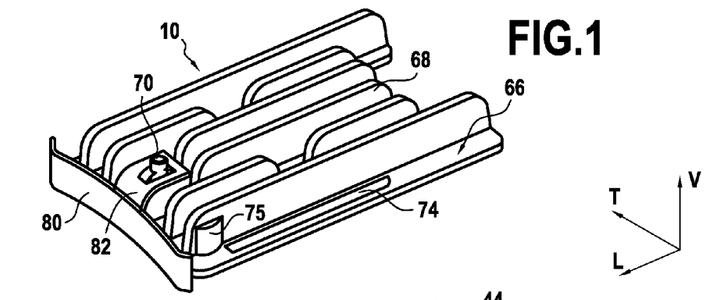
FIGS. 1 and 2 are three-quarter perspective views of the adapter in accordance with the invention from above and below, respectively.
Figure 2:
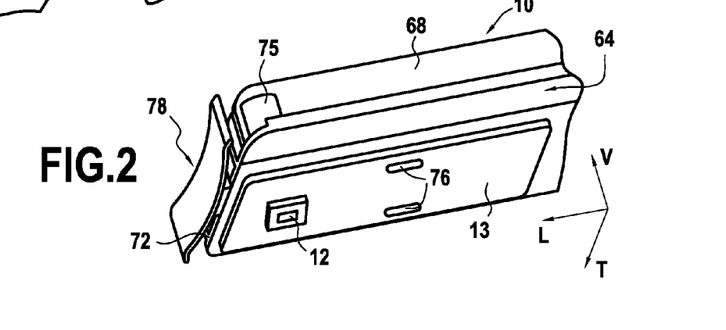
Figure 3:
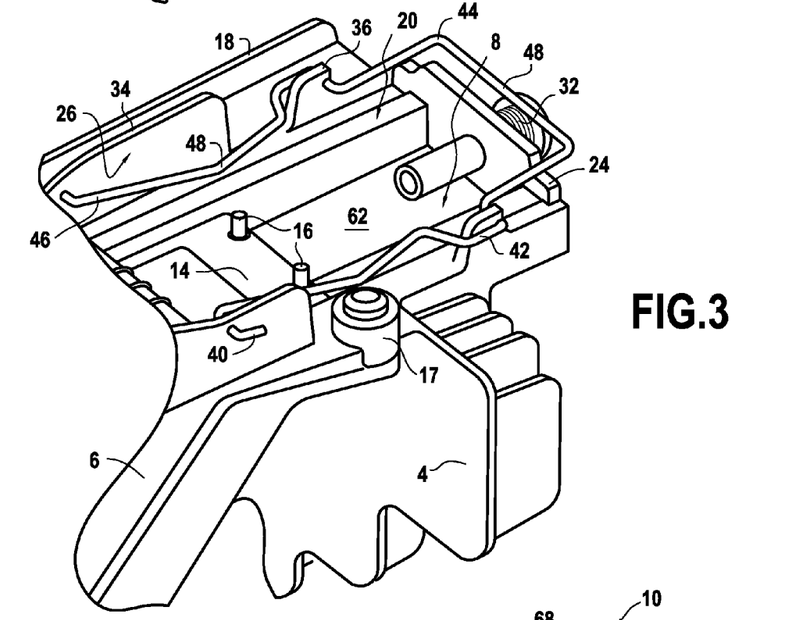
FIG. 3 is a three-quarter perspective view from above of the support means and the associated collector, without the adapter shown in FIGS. 1 and 2, exposing the housing that can receive it, the figure also showing the associated pressing means represented in a closed position and the associated clamping means.
Figure 4:
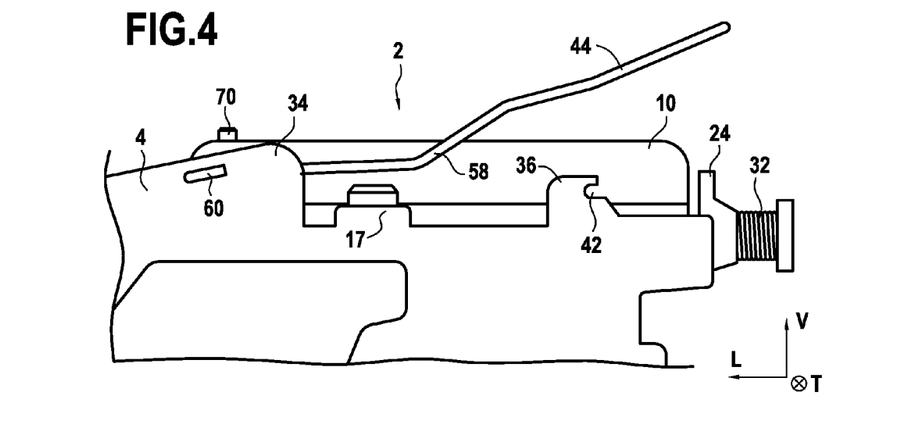
FIG. 4 is a partial side view of the lighting module, the adapter being in position in the housing of the support means, and the associated pressing means being shown during closing thereof.

The second plane face 66 also carries two longitudinal ribs 74 that extend along longitudinal sides so as to form means for receiving pressing means when the latter are in a closed position, as can be seen in FIG. 1.

A deflector 75 is disposed on the second plane face 66 in the vicinity of each longitudinal groove and forms an increased thickness of the rib 68 directly adjacent this groove.

In order to enable longitudinal adjustment of the adapter 10 in the housing 8, the adapter 10 has two oblong holes 76 through it, with the major axis longitudinal, with which the indexing pins 16 carried by the support means 4 of the elliptical collector 6 cooperate.

The two transverse sides consist in plane walls forming a regular bearing surface.

The adapter 10 further carries return elastic means 78 substantially facing the first transverse side 72. Here these elastic means 78 take the form of a curved leaf spring 80 disposed facing the first transverse side 72 and a lug 82 perpendicular to the leaf spring 80 and curved so as to interengage with the pin 70 fastened to the adapter 10, for example by way of appropriate clipping means.

The curved leaf spring 80 is pressed against the first transverse side 72 at its center and diverges from the adapter 10 at its ends. It is clear that the leaf spring 80 is therefore adapted to work in compression and to react by providing a longitudinal stress when the adapter 10 is in place in the housing 8.

In accordance with the invention, the lighting module 2 includes separate means for pressing the adapter 10 against the housing bottom wall 20 and immobilizing it in a first direction and means for adjusting the position of the adapter 10 in the housing 8 in a second direction perpendicular to the first direction.

These separate means include hooking means carried by the support means 4 and a rigid wire 44 articulated to the hooking means that form the pressing means and the curved leaf spring 80 and the clamping screw 32 that form the adjustment means.

When the adapter 10 is in place in the housing 8 of the support means 4 and the articulated wire 44 is in the closed position, pressed against the adapter 10 and immobilized in this position by clipping it onto the support means 4, and the clamping screw 32 is in the clamping position, axially compressing the associated spring of the adjustment means, the adapter 10 is retained in the housing 8 in three directions.

The support means 4 provide the mechanical connection between the elliptical collector 6 and the adapter 10 carrying the light-emitting diode, and the correct positioning of the diode relative to the first focus of the elliptical collector 6 can therefore be ensured by compliance with the mounting dimensions.

The cooperation of the adapter 10 and the support means 4 in the lighting module 2 in accordance with the invention is described in more detail next, and notably in the context of replacing a light source 12 in this lighting module 2.

Figure 5:
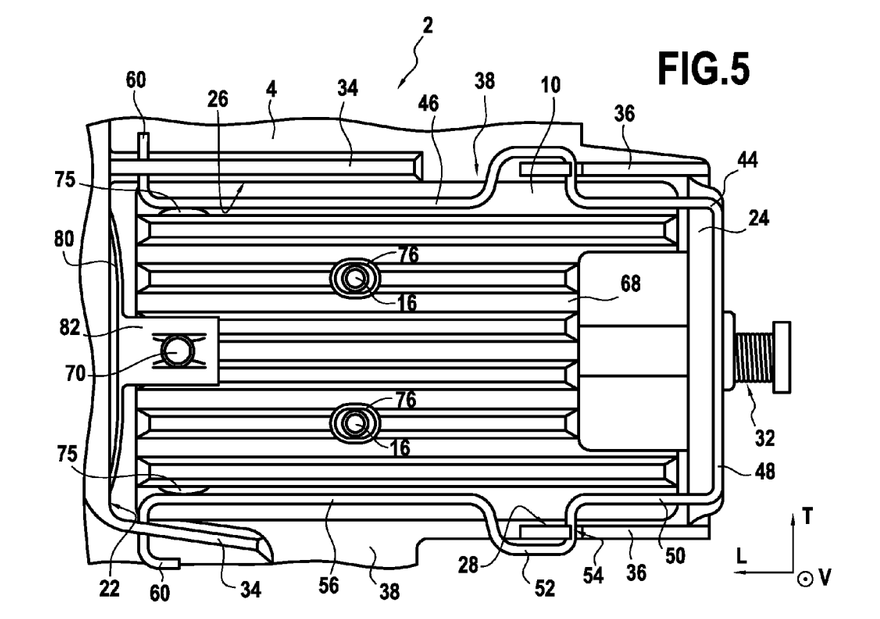
FIG. 5 is a partial view from above of the lighting module shown in FIG. 4.

To this end the adapter 10 is withdrawn from its functional position in the lighting module 2, as can be seen in FIG. 5. Initially, the adjustment means in the second direction are operated by unscrewing the clamping screw 32. This then moves in translation in this second direction, in the sense of disengagement, perpendicularly to the rear transverse wall 24 of the housing 8, which causes the curved leaf spring 80 that was previously compressed against the front transverse wall 22 of the housing 8 to relax. This elastic relaxation forces the adapter 10 away from the front transverse wall 22, the adapter 10 being guided longitudinally by the presence of the longitudinal walls 26 and 28 that flank the housing 8 and by the cooperation of the indexing pins 16 with the oblong openings formed in the adapter 10 and the printed circuit board 13. Note that the free end of the clamping screw 32 provides a stop for the elastic relaxation movement of the leaf spring 80. The articulated wire 44 is then disengaged from the grooves into which it was clipped and this wire 44 is pivoted about the axis passing through its anchor points in the support means 4 from a closed position in which it immobilizes the adapter 10 in a first direction, here vertical, to an open position in which the adapter 10 can be disengaged vertically.

The light source 12 associated with the adapter 10 is then changed. In the case of a light source 12 formed by a light-emitting diode and an associated printed circuit board 13, the diode or light source 12 may be removed from the printed circuit board 13 and the latter left in place against the first face of the adapter 10, or the printed circuit board 13 removed and replaced by another with a new diode or light source 12.

The adapter 10 is then placed in the housing 8, ensuring beforehand that the articulated wire is in its open position and the clamping screw 32 is in its disengaged position. The adapter 10 is placed against the bottom wall 20 of the housing 8, where applicable pressing the leaf spring against the front transverse wall of the housing 8.

In this position, the printed circuit board 13 is located in the opening formed in the bottom wall 20 so that the rays are allowed to pass toward the elliptical collector 6 and the printed circuit board 13 is not in contact with the support means 4, which makes it possible to prevent overheating of the electrical circuits. To this end the printed circuit board 13 faces the fixing plate of the elliptical collector 6 and has passing through it the indexing pins 16 carried by this printed circuit board 13 that are accommodated in the openings formed in the adapter 10 and the printed circuit board 13.

The articulated wire 44 is manipulated so as to move it into the closed position, in which it presses the adapter 10 against the bottom wall 20. As can be seen in FIG. 5, the deflectors make it possible to adjust the transverse position of the wire 44 while the curved shapes of the ends of the wire 44 provide play in this transverse direction. The lateral hooks formed on the wire 44 are clipped into the corresponding grooves formed in the lateral walls of the housing 8. This locks the position of the adapter 10 in a first direction, here vertical.

The position of the adapter 10 is then locked in a second, perpendicular direction, here the longitudinal direction. To this end, the clamping screw 32 is screwed into the threaded bore 30. The end of the clamping screw 32 advances into the housing 8 and pushes in the adapter 10 by virtue of contact with its second transverse side, which therefore moves toward the front transverse wall 22 of the housing 8.

The rotation of the clamping screw 32 leads to its movement transversely to the attached part forming the rear transverse wall 24 of the housing 8 and carrying the clamping screw 32, that is to say in the first direction, and this generates the movement of the adapter 10 in this same direction, the adapter 10 being pushed by virtue of contact between the end of the clamping screw 32 and the second transverse side of the adapter 10. The latter is therefore pushed toward the front transverse wall 22 of the housing 8 of the support means 4 and as a result the leaf spring 80 is pressed against the front transverse wall 22. The oblong shape of the openings cooperating with the indexing pins 16 enables longitudinal guidance of this movement. The cooperation of the indexing pins 16 and the oblong shape holes locates the adapter 10 transversely and simultaneously allows longitudinal adjustment by virtue of the effect of the leaf spring 80 and the clamping screw 32.

The thermal coating provided on the bottom wall 20, against which the adapter 10 is pressed, makes it possible to ensure that the longitudinal adjustment is effected with no friction reaction.

As an alternative to a thermal coating, the contact surfaces between the bottom wall 20 and the adapter 10 have a sufficiently precise finish to ensure contact between the adapter 10 and the bottom wall 20 with as little air as possible between them so as to transfer heat between the adapter 10 and the bottom wall 20.

The foregoing description explains clearly how the invention makes it possible to achieve the objectives set for it and notably to offer an adapter 10 and support means 4 in a lighting module 2 as a whole, which make it possible to replace a light source 12 and to be sure on re-assembly that the position of the new light source 12 is as reliable as the position of the light source 12 initially fitted. The support means 4 provided enable simple manipulation at the same time as ensuring a high precision of assembly. The adapter 10 and the support means 4 carry some or all of the means that in combination enable the assembly to be retained in position in the three directions in space.

The implementation of the means for adjustment in position in the second direction perpendicular to the first direction in which the adapter 10 is pressed against the bottom wall 20 advantageously makes it possible to ensure very precise adjustment in this second direction at the same time as facilitating implementation. In fact, it is seen that the leaf spring 80 loads the fit of the clamping screw 32 in the threaded bore 30 to allow a tolerance in the precision with which the internal and external threads of these screw means need to be manufactured.

Of course, the person skilled in the art can make diverse modifications to the structures of the lighting module 2 that have just been described by way of nonlimiting example.

Figure 6:
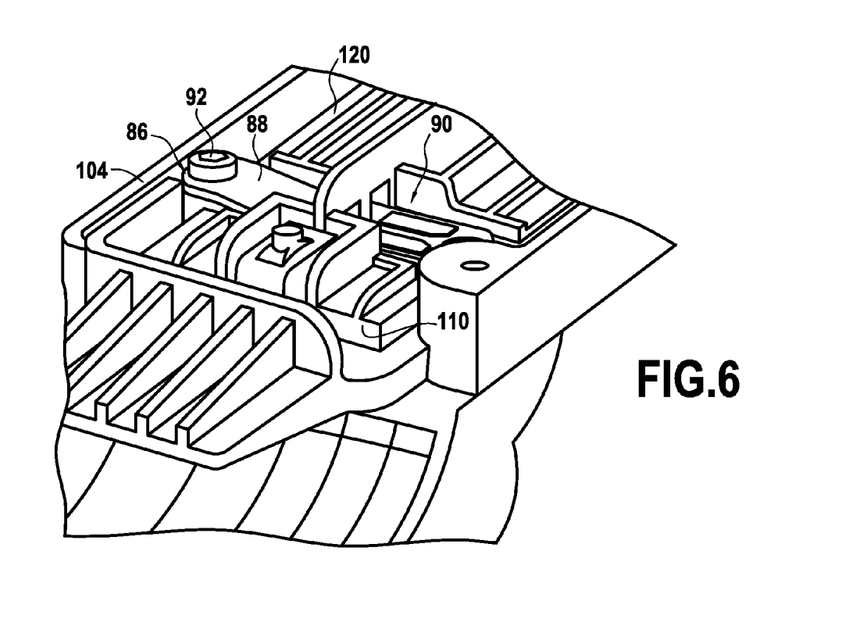
FIGS. 6 and 7 are partial three-quarter views of a second embodiment of a lighting module in accordance with the invention from the front and from the rear, respectively.
Figure 7:
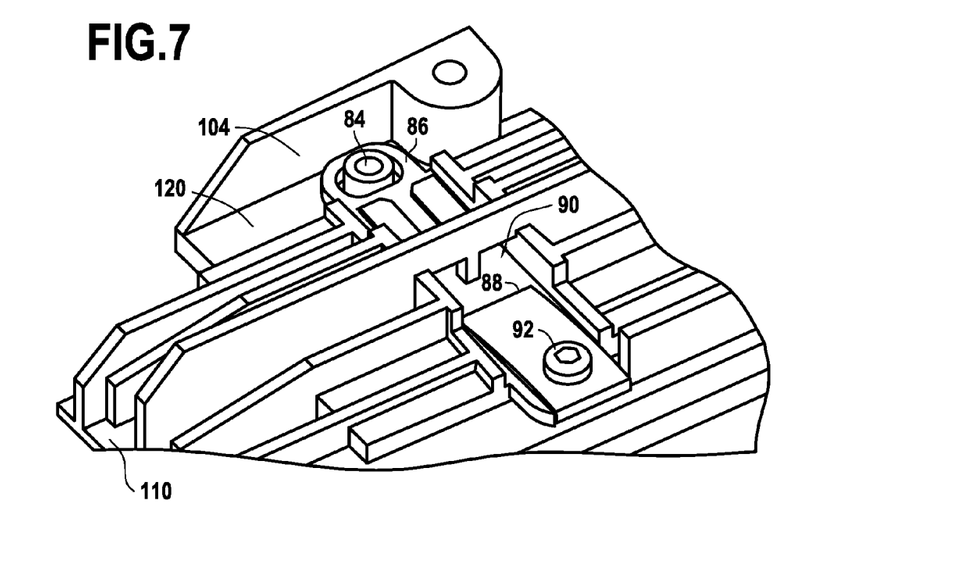

By way of example, a second embodiment shown in FIGS. 6 and 7 is described, in particular wherein the pressing means no longer take the form of an articulated wire 44, but a flat spring 88 fixed to the side of the housing 8 that extends over the upper face of the adapter 110 when the latter is positioned in the housing 8.

The support 104 includes on the bottom wall 120 two lateral pins 84 that are able to cooperate with eyelets 86 projecting laterally from the adapter 110. The eyelets 86 have a bore through them of oblong shape, the major axis of which extends in the second adjustment direction, so as to allow the adjustment of the position of the adapter 110 in the housing 8 as described above. When the adapter 110 is placed in the housing 8, the lateral pins 84 are positioned in the holes of the eyelets 86 after which the flat spring 88 is fixed to these pins 84 so that it extends substantially across the adapter 110, above the latter so that the means fixing the flat spring 88 to the pins 84 and the shape of the flat spring 88 apply a force pressing the adapter 110 against the support 104. As shown, a transverse channel 90 may be provided to receive the flat spring 88. It is clear that the flat spring 88 may be fixed to the pins 84, and notably to their free upper face, by various means and notably by screwing, by providing a fixing screw 92 adapted to cooperate with a threaded bore inside the pins 84. The flat spring 88 is screwed against the adapter 110 when the latter is in place and the flat spring 88 is unscrewed to remove it when it is required to withdraw the adapter 110 to change the light source 12. Although an operation of removing the flat spring 88 by unscrewing may appear more laborious than an operation of retraction by rotation of the articulated wire 44, this embodiment may prove particularly beneficial if overall size is a significant problem, and where it is notably not possible to cause the articulated wire 44 to pivot to a closed position from an open position allowing the adapter 110 to pass. The adjustment of the position in the second direction can then be effected as described above.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. An adapter configured to be placed and retained in position in a housing of support means of an optical collector of a motor vehicle, said adapter comprising a light source fastened to a support face of said adapter, said adapter having another face opposite said support face, said adapter having at least one receiving area situated on said another face opposite said support face and which receives at least a portion of pressing means that is situated on the support means of the optical collector, said pressing means urging said adapter in a first direction and said adapter having elastic return means mounted on an edge surface of said adapter, said elastic return means being compressed in a second direction when said adapter is mounted on the housing of the optical collector, wherein said second direction is generally perpendicular to said first direction;

wherein said light source becomes positioned in operative relationship with the optical collector when said adapter is mounted on the housing;

wherein said elastic return means are on said edge surface of said adapter, said edge surface being generally perpendicular to said support face;

wherein said elastic return means take the form of a leaf spring.

2. The adapter according to claim 1, wherein said leaf spring is fixed at its center to be pressed against said edge surface of said adapter, and having a curved shape so that in a rest position of said leaf spring its ends are away from said edge surface.

3. The adapter according to claim 1, wherein said leaf spring further includes a lug that extends from the center thereof and that engages with a pin fastened to said face of said adapter opposite said support face of said light source.

4. The adapter according to claim 1, wherein said light source is a light-emitting diode carried by a printed circuit board fastened to said support face of said adapter.

5. The adapter according to claim 1, wherein said face opposite said support face of said light source includes ribs that project in said first direction.

6. The adapter according to claim 1, wherein said at least one receiving area of said adapter receives said at least a portion of pressing means and comprises grooves that extend in said second direction along edges of said adapter.

7. The adapter according to claim 1, wherein said at least one receiving area of said adapter receives said at least a portion of pressing means and comprises a transverse channel that extends perpendicularly to said second direction.

8. A lighting module for lighting or signaling in a motor vehicle, including at least one collector that reflects light rays so that the latter are emitted along a given optical axis, support means partly covering said at least one collector, and an adapter carrying a light source adapted to emit said light rays, said support means including a housing that receives said adapter, wherein said lighting module includes separate means for pressing said adapter in a first direction and for the adjustment in position of said adapter in a second direction other than said first direction which is generally perpendicular to said first direction;

wherein position adjustment means carried by said lighting module comprising a clamping screw disposed transversely to an end wall of said housing, said clamping screw being adapted to cooperate with a threaded bore in an end face to penetrate into said housing in said second direction as a result of its rotation to press against said adapter.

9. The lighting module according to claim 8, wherein said clamping screw is a micrometer screw.

10. The lighting module according to claim 8, wherein said end wall of said housing carrying said threaded bore is formed in the thickness of said support means.

11. The lighting module according to claim 8, wherein said end wall of said housing carrying said threaded bore is formed by a part mounted on and fixed to said support means.

12. A motor vehicle lighting or signaling assembly including a lighting module for lighting or signaling in a motor vehicle, including at least one collector that reflects light rays so that the latter are emitted along a given optical axis, support means partly covering said at least one collector, and an adapter carrying a light source adapted to emit said light rays, said support means including a housing that receives said adapter, wherein said lighting module includes separate means for pressing said adapter in a first direction and for the adjustment in position of said adapter in a second direction other than said first direction which is generally perpendicular to said first direction, wherein:

said adapter is placed and retained in position in said housing of said support means of said at least one collector, includes a light source fastened to one face of said adapter, and includes on a face opposite a support face of said light source at least one area receiving pressing means acting in a first direction, said lighting module and said adapter carry separate means for pressing said adapter against said support means of said lighting module in a first direction and for the adjustment in position, in a second direction other than said first direction, of said adapter in said housing formed in said support means, and said motor vehicle lighting or signaling assembly includes elastic return means adapted to be compressed in said second direction, said elastic return means being positioned between said support means and said adapter and carried by said support means or said adapter.

13. The motor vehicle lighting or signaling assembly according to claim 12, wherein said position adjustment means include an adjustment screw carried by said support means and elastic return means carried by said adapter, the action of said adjustment screw against a face of said adapter leading to the compression of said elastic return means between an opposite face of said adapter against a wall of said housing formed in said support means.

14. The motor vehicle lighting or signaling assembly according to claim 12, wherein said pressing means take the form of a rigid wire articulated so as to go from an open position, in which said rigid wire allows free access to said housing formed in said support means, to a closed position, in which said rigid wire is across said housing, said rigid wire being held in said closed position by clipping hooks formed by deformation of said rigid wire into female receiving means provided for this purpose on said support means.

15. The lighting module according to claim 14, wherein said rigid wire is articulated to said support means.

16. The motor vehicle lighting or signaling assembly according to claim 12, wherein said pressing means take the form of a flat spring fixed onto pins formed laterally in said support means of said lighting module, so as to extend transversely above said adapter.

\* \* \* \* \*